United States Patent [19]
Inoue

[11] Patent Number: 5,313,428
[45] Date of Patent: May 17, 1994

[54] FIELD MEMORY SELF-REFRESHING DEVICE UTILIZING A REFRESH CLOCK SIGNAL SELECTED FROM TWO SEPARATE CLOCK SIGNALS

[75] Inventor: Kouji Inoue, Osaka, Japan

[73] Assignee: Sharp Kabushiki Kaisha, Osaka, Japan

[21] Appl. No.: 928,659

[22] Filed: Aug. 17, 1992

Related U.S. Application Data

[63] Continuation of Ser. No. 643,689, Jan. 19, 1991, abandoned, which is a continuation of Ser. No. 269,353, Nov. 10, 1988, abandoned.

[30] Foreign Application Priority Data

Nov. 12, 1987 [JP] Japan ................... 62-287605

[51] Int. Cl.$^5$ .................. G11C 11/406; G11C 8/00
[52] U.S. Cl. .................... 365/222; 365/233; 365/230.02; 365/236
[58] Field of Search ........... 365/222, 223, 193, 230.02, 365/236, 229

[56] References Cited

U.S. PATENT DOCUMENTS

| | | | |
|---|---|---|---|
| 4,334,295 | 6/1982 | Nagami et al. | 365/222 |
| 4,570,242 | 2/1986 | Nagami | 365/222 |
| 4,616,346 | 10/1986 | Nakaizumi et al. | 365/222 |
| 4,985,868 | 1/1991 | Nakano et al. | 365/222 |

*Primary Examiner*—Glenn Gossage

[57] ABSTRACT

A field memory self-refreshing device self-refreshes a field memory with a refresh clock signal derived from a reference clock and a self-refresh clock signal not derived from the reference clock. The field memory self-refreshing device has a reference clock stop determination circuit, a self-refresh clock generator and a refresh clock switching circuit. The reference clock stop determination circuit detects that input from the reference clock has stopped and outputs a reference clock stop signal when input from the reference clock stops. The self-refresh clock generator generates the basis for the self-refresh clock signal used for self-refreshing of the field memory when the reference clock stops. When the refresh clock switching circuit receives the reference clock stop signal from the reference clock stop determination circuit, the refresh clock switching circuit switches from a selection of the refresh clock signal based on the reference clock to a selection of the self-refresh clock signal.

17 Claims, 4 Drawing Sheets

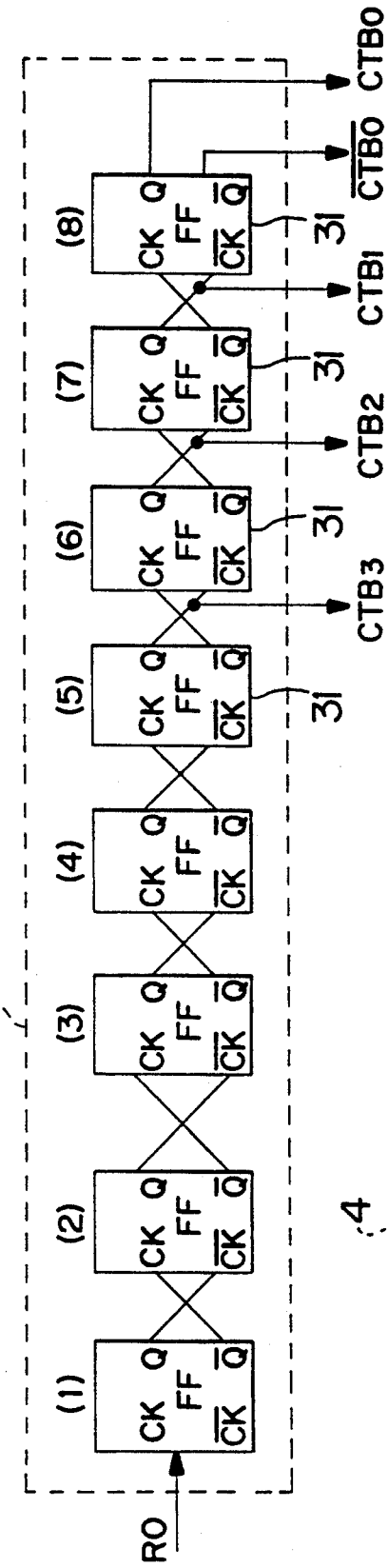
FIG. 3
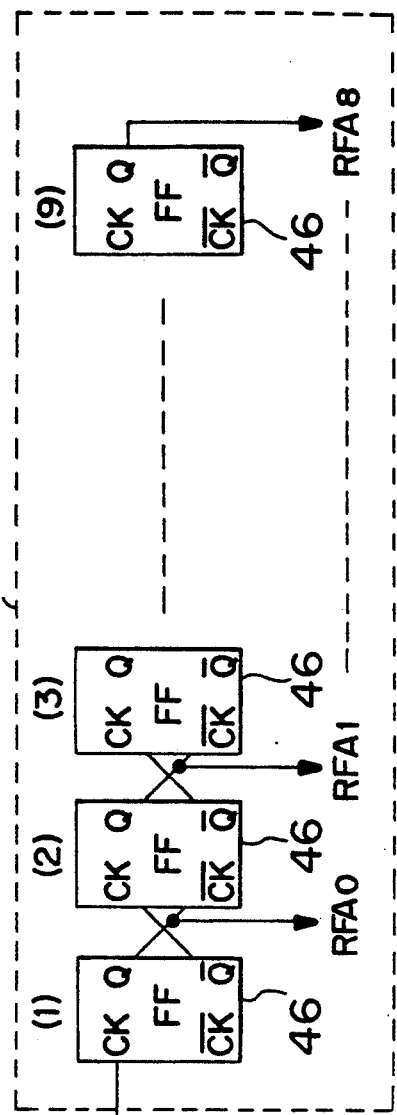
FIG. 4
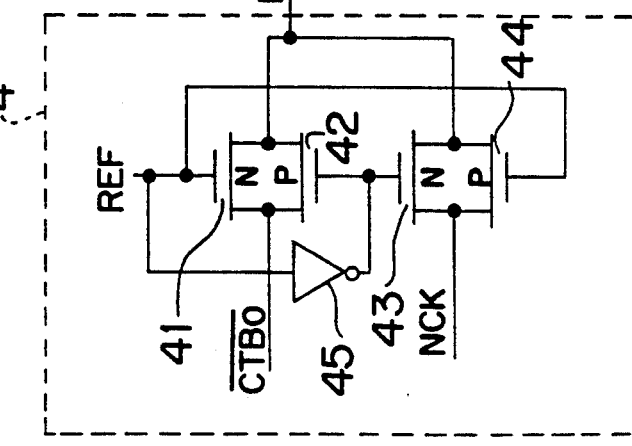

FIELD MEMORY SELF-REFRESHING DEVICE UTILIZING A REFRESH CLOCK SIGNAL SELECTED FROM TWO SEPARATE CLOCK SIGNALS

This application is a continuation of application Ser. No. 07/643,689 filed on Jan. 19, 1991, now abandoned, which is a continuation of application Ser. No. 07/269,353, filed on Nov. 10, 1988, now abandoned.

BACKGROUND OF THE INVENTION

The present invention relates to a field memory self-refreshing device.

Because dynamic random access memory (DRAM) devices store data as electrical charges in memory cells, the accumulated electrical charge may be decreased by leakage current or other factors. Thus, it is necessary to periodically refresh all memory cells within a regular time period by increasing the charge and thus rewritting the aforementioned memory cells.

A field memory which is able to serially read/write, based on a reference clock, data of a single field in a television or video tape recorder which has the same memory cell structure as a DRAM memory cell. However, when the picture is scanned to display images based on the data in the field memory, the memory cells of the field memory are accessed serially based on a reference clock, and the result is the same as when the field memory is automatically refreshed. For example, when a single field of an NTSC color television signal is stored in a field memory, the refresh operation occurs every 16.6 ms because the field frequency of the NTSC signal is 60 Hz. However, when the memory cell access time is two to three times slower than the reference clock cycle, the refresh period becomes longer, possibly longer than the data hold time limit of the memory cell, and a self-refresh device becomes necessary.

Conventional field memory self-refresh devices are able to store the data for a single horizontal scan line in a single line memory block. Therefore, a refresh clock which executes multiple refresh operations while accessing the data for a single line (the same row address) is generated according to the reference clock and inputted to the refresh counter. Furthermore, a row address strobe signal for latching the refresh address is generated based on the aforementioned reference clock, and the refresh address from the aforementioned refresh counter is latched.

However, because the self-refresh device of the aforementioned conventional field memory generates the refresh clock and the row address strobe signal based on the aforementioned reference clock, the refresh clock and row address strobe signal generation operations will terminate if the reference clock stops, and the information in the memory cell will be destroyed.

SUMMARY OF THE INVENTION

The objective of the present invention is to provide a field memory self-refreshing device which can maintain data stored in the memory cell of a field memory even in the standby state by identifying that a reference clock stops, thereby automatically selecting a self-refresh clock which produces without any relation with the reference clock, and entering the self-refresh operation when the field memory enters a reference clock stop (standby) condition.

To achieve the aforementioned objective, the present invention provides a field memory self-refreshing device which self-refreshes a field memory with a refresh clock output according to a reference clock condition and which is characterized by a reference clock stop determination circuit which detects that input from the reference clock has stopped and outputs a reference clock stop signal when input from the reference clock stops. The present invention also includes a self-refresh clock generating circuit which generates a self-refresh clock used for self-refresh of the field memory when the reference clock stops and a refresh clock switching circuit which, when the reference clock stop signal is received from the reference clock stop determination circuit, switches from a selection of the refresh clock based on the reference clock to a selection of a self-refresh clock outputted form the self-refresh clock generating circuits.

A self-refresh device constructed as described above operates as follows.

A self-refresh clock which is used to self-refresh the field memory when the reference clock stops is generated by a self-refresh clock generator. Furthermore, when the input of the reference clock stops, it is detected by the reference clock stop determination circuit that reference clock input has stopped, and a reference clock stop signal is outputted. When this occurs, the refresh clock switch circuit switches from a selection of the refresh clock based on the reference clock to a selection of a self-refresh clock outputted from the self-refresh clock generating circuit when the reference clock stop signal is received from the reference clock stop determination circuit.

Therefore, the field memory can be self-refreshed based on the self-refresh clock outputted from the self-refresh clock generating circuit irrespective of the reference clock even when a standby state is present.

BRIEF DESCRIPTION OF THE DRAWINGS

The present invention will become more fully understood from the detailed description given below and the accompanying drawings which are given by way of illustration only, and thus are not limitative of the present invention, and wherein:

FIG. 3 is a circuit diagram of the self-refresh clock generator;

FIG. 4 is a circuit diagram of the refresh clock switch circuit and refresh counter.

DETAILED DESCRIPTION OF PREFERRED EMBODIMENTS

Figure 1:
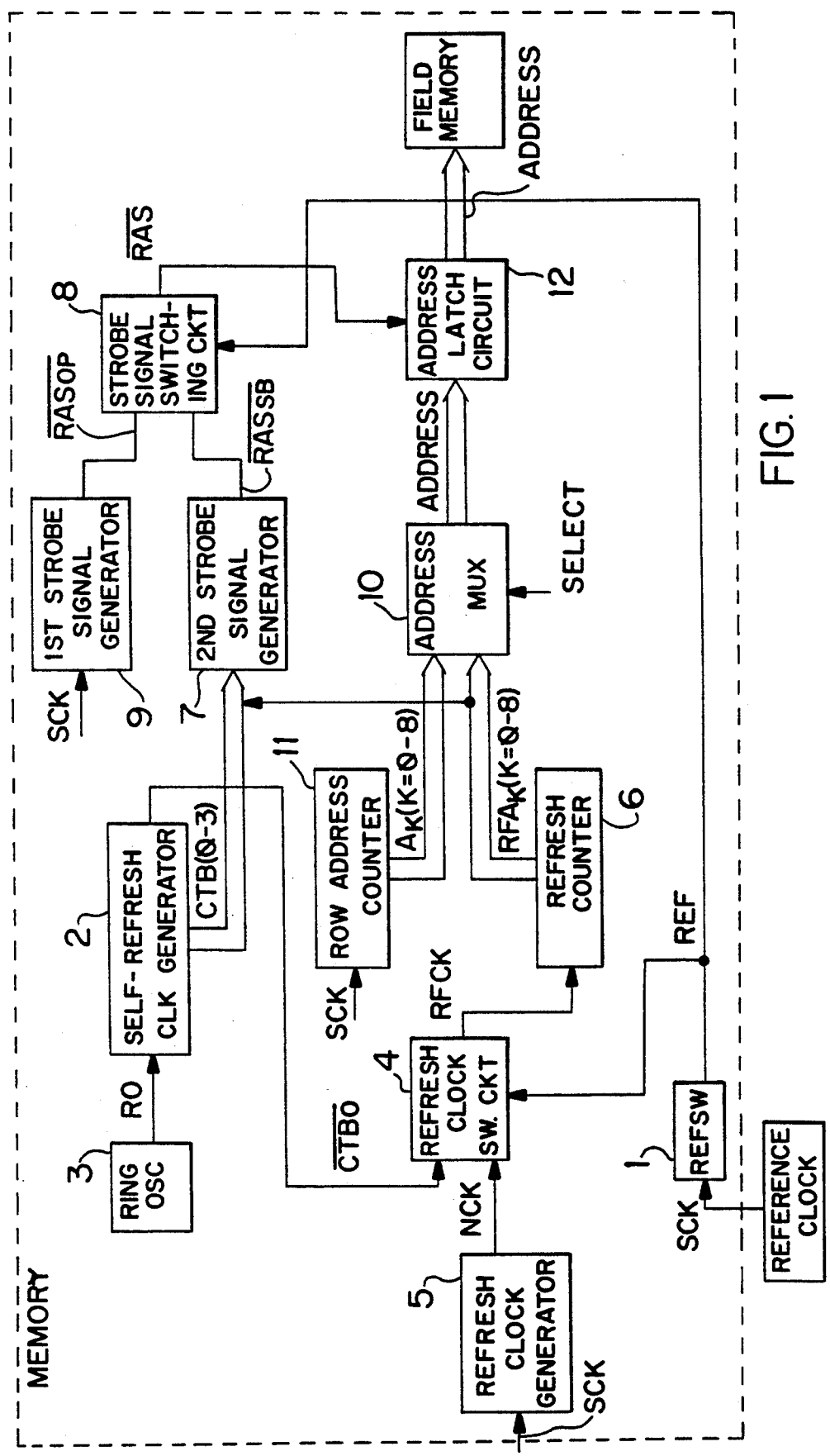
FIG. 1 is a block diagram of a preferred embodiment of a field memory self-refreshing device according to the present invention.

FIG. 1 is a block diagram of a preferred embodiment of a field memory self-refreshing device according to the present invention.

Refresh switching circuit (REFSW) 1, which is a reference clock stop determination circuit, determines whether reference clock signal SCK, which is a serial clock signal, is being inputted, and outputs result signal REF. If reference clock signal SCK is not being inputted, REFSW 1 switches to the side which triggers the self-refresh operation which will be described below. Self-refresh clock generator 2 generates self-refresh clock ($\overline{CTBo}$) based on output signal RO from ring oscillator 3 to execute the refresh operation on a field memory when the aforementioned reference clock SCK signal is stopped (below referred to as the standby state).

Based on result signal REF outputted from the REFSW 1, refresh clock switch circuit 4 selects normal refresh clock NCK outputted from refresh clock generator 5 when reference clock SCK is inputted, and selects self-refresh clock ($\overline{CTBo}$) outputted from self-refresh clock generator 2 when the reference clock SCK is not inputted, and outputs refresh clock RFCK. The refresh clock RFCK is inputted to refresh counter 6, and the refresh counter 6 is incremented according to the input of refresh clock RFCK, and outputs the next address that should be refreshed in the field memory. Address multiplexer 10 selects the address data from the refresh counter 6 or the row address data from row address counter 11, and outputs the selected address. The signal SELECT which controls the multiplexer 10 may be generated in a manner well known to those of ordinary skill in the art.

Standby state row address strobe signal generator 7, which functions as a 2nd strobe signal generator, outputs a strobe signal to cause the latching of the aforementioned refresh address during the standby state, and based on the signal (CTB0-CTB3) from self-refresh clock generator 2, outputs standby state row address strobe signal ($\overline{RASSB}$). Row address strobe signal switching circuit 8 operates as described below and outputs row address strobe signal ($\overline{RAS}$) to latch the refresh address each time the refresh counter 6 is incremented by refresh clock RFCK input. The address is latched in a row address latch circuit 12. Specifically, strobes signal switching circuit 8 selects normal row address strobe signal ($\overline{RASOP}$) outputted from normal row address strobe signal generator 9, which is a 1st strobe signal generator, when reference clock SCK is generated according to result signal REF outputted from REFSW 1, and selects standby state row address strobe signal ($\overline{RASSB}$) outputted from standby row address strobe signal generator 7, when reference clock SCK is not inputted when the signal REF indicates the non-generation of reference clock signal SCK and then outputs row address strobe signal ($\overline{RAS}$).

Then, the refresh address selected by address multiplexer 10 is latched based on row address strobe signal ($\overline{RAS}$) outputted form the strobe signal switching circuit 8, and the self-refresh operation is executed.

The operation of the aforementioned REFSW 1, self-refresh clock generator 2, refresh clock switch circuit 4, refreshment counter 6, 2nd strobe signal generator 7, and strobe signal switching circuit 8 are described in detail below.

Figure 2:
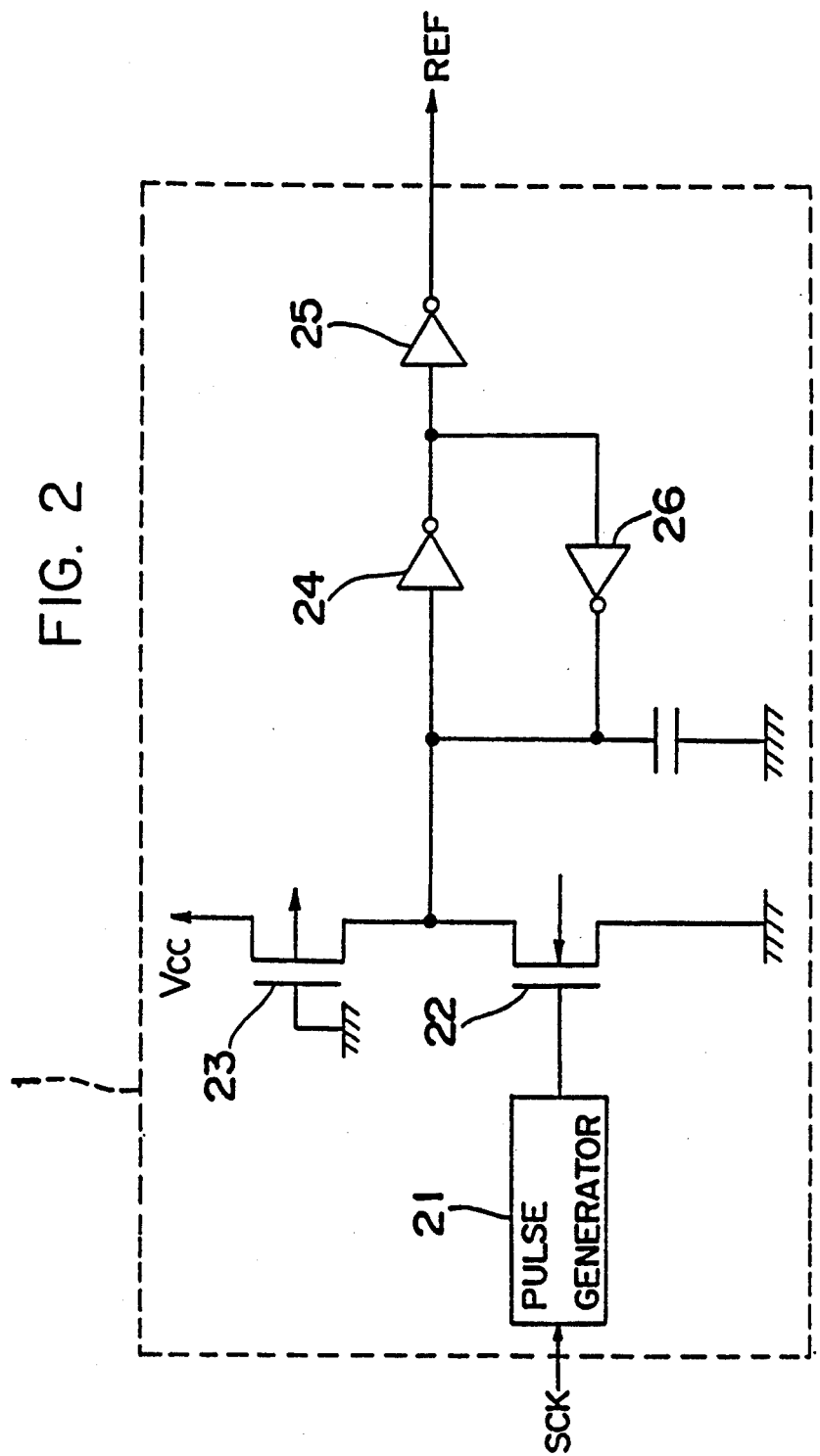
FIG. 2 is a circuit diagram of the refresh switching circuit.

As shown in FIG. 2, the aforementioned REFSW 1 consists of time interval pulse generator 21, MOS transistors 22 and 23, and inverters 24, 25 and 26. Time interval pulse generator 21 generates a positive pulse synchronized to a leading edge or a trailing edge of reference clock SCK, and the period of this pulse is sufficiently smaller than the time constant corresponding to the next stage of the refresh switching circuit. Therefore, result signal REF outputted during the reference clock SCK input remains LOW, and result signal REF outputted when reference clock SCK input stops becomes HIGH. In a preferred embodiment of the present invention, the time constant at which result signal REF changes from LOW to HIGH is set to approximately 2.7 milliseconds.

As shown in FIG. 3, self-refresh clock generator 2 consists of an eight stage binary counter which frequency divides the approximately 30-MHz output signal RO outputted from ring OSC 3 to 1/256, thus producing the approximately 8-millisecond cycle self-refresh clock ($\overline{CTBo}$) which is inputted to refresh counter 6 is in the standby state.

As shown in FIG. 4, the aforementioned refresh clock switch circuit 4 consists of N-channel MOS transistors 41 and 43, P-channel MOS transistors 42 and 44, and inverter 45. Result signal REF outputted from the aforementioned REFSW 1 is inputted to the gate terminals of N-channels MOS transistor 41 and P-channel MOS transistor 44. Furthermore, a signal which is the result signal REF inverted by inverter 45 is inputted to the gate terminals of P-channel MOS transistor 42 and N-channel MOS transistor 43. Thus, in the normal state when reference clock SCK is inputted, a LOW result signal REF is inputted and transistors 43 and 44 are ON. Then, normal refresh clock NCK inputted from refresh clock generator 5 is selected, and refresh clock RFCK is outputted. Furthermore, during the standby state when reference clock SCK is not inputted, a high result signal REF is inputted and transistors 41 and 42 are ON. The, self-refresh clock ($\overline{CTBo}$) is input from the self-refresh clock generator 2, and refresh clock RFCK is output.

As shown in FIG. 4, the aforementioned refresh counter 6 is composed of binary counters in nine stages, and outputted signal RFA0, RFA1, through RFA8 output from terminals Q of flip-fops 46 at each stage of the binary counter are inputted as the refresh address data to address multiplexer 10.

Figure 5:
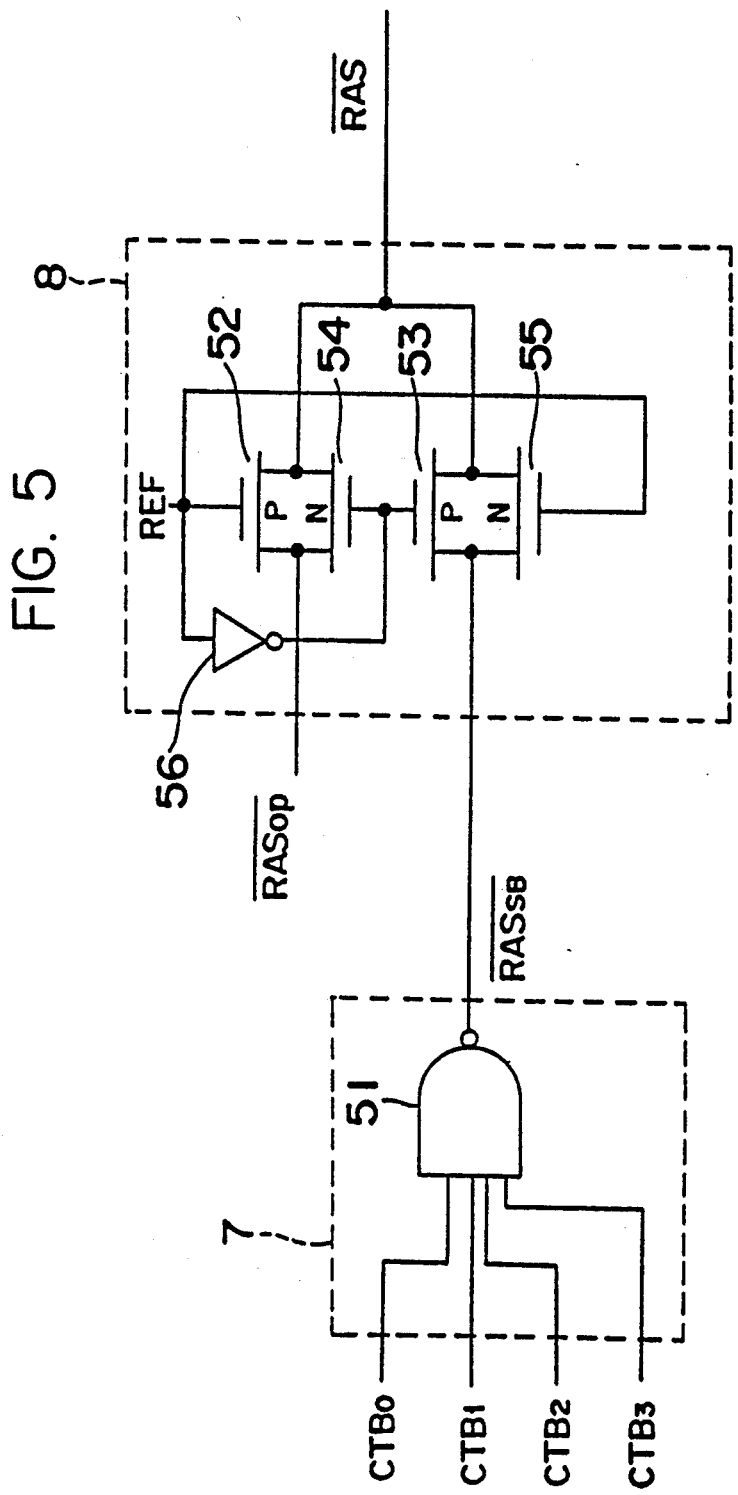
FIG. 5 is a circuit diagram of the second row address strobe signal generator circuit and the row address strobe signal circuit switching circuit.

As shown in FIG. 5, the aforementioned 2nd strobe signal generator 7 consists of NAND gate 51 to which is inputted output signals CTB3, CTB2, CTB1, and CTB0 of terminals Q of flip-flops 31 of stages 5, 6, 7, and 8 of self-refresh clock generator 2, and outputs standby state row address strobe signal ($\overline{RASSB}$).

As shown in FIG. 5, the aforementioned strobe signal switching circuit 8 consists of P-channel MOS transistors 52 and 53, N-channel MOS transistors 54 and 55, and inverter 56. Result signal REF outputted from the aforementioned REFSW 1 is inputted to the gate terminals of P-channel MOS transistor 52 and N-channel MOS transistor 55. Furthermore, a signal which is the result signal REF inverted by inverter 56 is inputted to the gate terminals of N-channel MOS transistor 54 and P-channel MOS transistor 53. Thus, in the normal state, a LOW result signal REF is inputted and transistors 52 and 54 operate so that normal state row address strobe signal ($\overline{RASOP}$) inputted from 1st strobe signal generator 9 (FIG. 1) is selected, and row address strobe signal ($\overline{RAS}$) is outputted. Furthermore, in the standby state, a HIGH result signal REF is inputted and transistor 53 and 55 operate so that standby state row address strobe signal ($\overline{RASSB}$) inputted from 2nd strobe signal generator 7 is selected, and row address strobe signal ($\overline{RAS}$) is outputted.

Thus, the switching action of REFSW 1 causes refresh clock switch circuit 4 and strobe signal switching circuit 8 to switch so that in the normal state, the refresh address outputted form refresh counter 6 in response to normal refresh clock NCK is latched in response to normal state row address strobe signal ($\overline{RASOP}$), and the field memory is refreshed. Similarly, in the standby state, the refresh address outputted from refresh counter 6 in response to self-refresh clock ($\overline{CTBo}$) is latched in response to standby state row address strobe signal ($\overline{RASSB}$), and the field memory is refreshed. Therefore, when the field memory enters the standby state; reference clock SCK is determined to have stopped, the self-refresh operation based on self-refresh clock ($\overline{CTBo}$) is automatically started, and the data stored in the memory cells of the field memory can be maintained.

According to the present invention, as clarified by the above-mentioned description, a field memory self-refresh device which self-refreshes the field memory with a refresh clock output in response to a reference clock state that is determined by a reference clock stop determination circuit includes a self-refresh clock generator and refresh clock switch circuit; which is able to self-refresh a field memory even in the standby state and thus maintain data stored in the memory cells of the field memory. When the reference clock stop determination outputs a reference clock stop signal, the refresh clock switch circuit switches from the selection of the refresh clock based on the reference clock to the selection of the self-refresh clock outputted form the self-refresh clock generator, thereby refreshing the field memory irrespective of the reference clock state.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A field memory self-refreshing device for self-refreshing a field memory according to a refresh clock signal based on an operational state of a reference clock, comprising:
   reference clock stop determination means for detecting when the reference clock has stopped and for outputting a reference clock stop signal when the reference clock has stopped;
   self-refresh clock generating means, connected to said reference clock stop determination means, for generating a self-refresh clock signal for self-refreshing the field memory when the reference clock has stopped; and
   refresh clock switching means, connected to said self-refresh clock generating means, for selecting a normal refresh clock signal to be outputted when the reference clock has not stopped or for selecting said self-refresh clock signal outputted from said self-refresh clock generating means to be outputted when the reference clock has stopped.

2. The field memory self-refreshing device as claimed in claim 1, wherein said reference clock stop determination means includes time interval pulse generator means, synchronized to a leading edge or a trailing edge of the reference clock signal, for generating a pulse with a period smaller than a period of the reference clock signal.

3. The field memory self-refreshing device as claimed in claim 1, wherein said self-refresh clock generating means includes binary counter means for frequency-dividing an input signal to generate said self-refresh clock signal.

4. The field memory self-refreshing device as claimed in claim 1, wherein said refresh clock switching means includes first switching means for selecting said normal refresh clock signal when the reference cock has not stopped and second switching means for selecting said self-refresh clock signal outputted from said self-refresh clock generating means when the reference clock has stopped.

5. The field memory self-refreshing device as claimed in claim 1 further comprising:
   first counting means for generating an address signal representing a memory address;
   refresh counting means for counting said normal refresh clock signal when said normal refresh clock signal is selected by said refresh clock switching means and for outputting a refresh address signal, corresponding to the counted normal refresh clock signal, representing a memory location to be refreshed;
   said refresh counting means counting said self-refresh clock signal when said self-refresh clock signal is selected by said refresh clock switching means and outputting a refresh address signal, corresponding to the counted self-refresh clock signal, representing a memory location to be refreshed;
   first strobe signal generating means for generating a first strobe signal;
   second strobe signal generating means for generating a second strobe signal;
   strobe signal switching means, responsive to said reference clock stop signal, for selecting said first strobe signal when the reference clock has not stopped or for selecting said second strobe signal when the reference clock has stopped and said reference clock stop signal is generated by said reference clock stop determination means; and
   latching means, responsive to said strobe signal switching means, for latching a selected one of said address signal representing the memory address and said refresh address signal corresponding to the counted normal refresh clock signal when said first strobe signal is selected by said strobe signal switching means, and for latching said refresh address signal corresponding to the counted self-refresh clock signal when said second strobe signal is selected by said strobe signal switching means.

6. The field memory self-refreshing device as claimed in claim 5, wherein said refresh counting means is a binary counter.

7. The field memory self-refreshing device as claimed in claim 5, wherein said strobe signal switching means includes first switching means, responsive to the reference clock signal, for selecting said first strobe signal and second switching means, responsive to said reference clock stop signal, for selecting said second strobe signal.

8. The field memory self-refreshing device as claimed in claim 5, wherein said reference clock stop determination means includes time interval pulse generator means, synchronized to a leading edge or a trailing edge of the reference clock signal, for generating a pulse with a period smaller than a time period of the reference clock signal.

9. The field memory self-refreshing device as claimed in claim 5, wherein said self-refresh clock generating means includes binary counter means for frequency-dividing an input signal to generate said self-refresh clock signal.

10. The field memory self-refreshing device as claimed in claim 5, wherein said refresh clock switching means includes first switching means for selecting said normal refresh clock signal when the reference clock has not stopped and second switching means for selecting said self-refresh clock signal when the reference clock has stopped.

11. A field memory self-refreshing device for refreshing a field memory, comprising:
   reference clock means for generating a reference clock signal;
   reference clock stop determination means, connected to said reference clock means, for determining when said reference clock means has stopped generating said reference clock signal; and
   refresh signal generating means, connected to said reference clock means and said reference clock stop determination means, for generating a self-refresh clock signal and a normal refresh clock signal, and having an output for outputting said self-refresh clock signal when said reference clock means has stopped generating said reference clock signal and for outputting said normal refresh clock signal when said reference clock means has not stopped generating said reference clock signal.

12. The field memory self-refreshing device as claimed in claim 11, wherein said refresh signal generating means outputs said normal refresh clock signal when said reference clock means is not stopped.

13. The field memory self-refreshing device as claimed in claim 11, wherein said reference clock determination means comprises:
   time interval pulse generator means, synchronized to a leading edge or falling edge of said reference clock signal, for generating a pulse having a period smaller than a period of said reference clock signal.

14. The field memory self-refreshing device as claimed in claim 11 further comprising:
   first counting means for generating an address signal representing a memory address;
   second counting means, responsive to the output of said refresh signal generating means, for generating a refresh address signal representing a memory location to be refreshed;
   first strobe signal generating means for generating a first strobe signal;
   second strobe signal generating means, connected to said refresh signal generating means, for generating a second strobe signal;
   strobe signal switching means, responsive to said reference clock stop determination means, for selecting said second strobe signal when said reference clock has stopped and for selecting said first strobe signal when said reference clock has not stopped; and
   latching means, responsive to said strobe signal switching means, for latching a refresh address signal representing a memory location to be refreshed corresponding to a counted self-refresh clock signal when said second strobe signal is selected by said strobe signal switching means, and for latching a selected one of said address signal representing the memory address and a refresh address signal representing a memory location to be refreshed corresponding to a counted normal refresh clock signal when said first strobe signal is selected by said strobe signal switching means.

15. A method for refreshing a field memory comprising the steps of:
   (a) generating a reference clock signal;
   (b) generating a normal refresh clock signal;
   (c) generating a self-refresh clock signal;
   (d) determining if the reference cock signal is being generated;
   (e) selecting the normal refresh clock signal as a memory refresh clock signal when the reference clock signal is determined to be generated in said step (d);
   (f) selecting the self-refresh clock signal as the memory refresh clock signal when the reference clock signal is determined not to be generated in said step (d); and
   (g) refreshing the field memory using the normal refresh clock signal selected in said step (e) or the self-refresh signal selected in said step (f).

16. The method as claimed in claim 15, further comprising the steps of:
   (h) selectively generating a normal refresh address signal representing a memory location to be refreshed when the normal refresh clock signal is selected in said step (e), the normal refresh address signal being derived from the normal refresh clock signal or a self-refresh address signal representing a memory location to be refreshed when the self-refresh clock signal is selected in said step (f), the self-refresh address signal being derived from the self-refresh clock signal; and
   (i) latching the refresh address signal generated in said step (h).

17. The method as claimed in claim 16, wherein said step (i) comprises the sub-steps of:
   (i1) generating a first strobe signal;
   (i2) generating a second strobe signal;
   (i3) selecting the first strobe signal when the reference clock signal is determined to be generated in said step (d) and selecting the second strobe signal when the reference clock signal is determined not to be generated in said step (d); and
   (i4) latching the selected refresh address signal in response to the strobe signal selected in said sub-step (i3).

* * * * *